(12) United States Patent
Bennett

(10) Patent No.: US 6,570,777 B1
(45) Date of Patent: May 27, 2003

(54) HALF SINE WAVE RESONANT DRIVE CIRCUIT

(75) Inventor: Paul George Bennett, Bristol (GB)

(73) Assignee: ENI Technology, Inc., Rochester, NY (US)

(*) Notice: Subject to any disclaimer, the term of this patent is extended or adjusted under 35 U.S.C. 154(b) by 0 days.

(21) Appl. No.: 10/007,882

(22) Filed: Dec. 6, 2001

(51) Int. Cl.[7] .............................................. H02M 3/335
(52) U.S. Cl. .................................. 363/21.03; 363/21.02
(58) Field of Search ............................ 363/21.02, 21.03

(56) References Cited

U.S. PATENT DOCUMENTS

| | | | | |
|---|---|---|---|---|
| 3,887,840 A | * | 6/1975 | Maytum ..................... 315/389 |
| 4,417,153 A | * | 11/1983 | Onodera et al. ............. 307/140 |
| 5,023,566 A | | 6/1991 | El-Hamamsy et al. ...... 330/251 |
| 5,056,031 A | * | 10/1991 | Nakano et al. .............. 700/178 |
| 5,359,244 A | | 10/1994 | Hopkins ...................... 307/571 |
| 5,475,296 A | | 12/1995 | Vinsant et al. .............. 323/223 |
| 5,572,095 A | * | 11/1996 | Krause ........................ 315/408 |
| 5,598,324 A | * | 1/1997 | Imamura et al. ............ 363/131 |
| 5,602,505 A | | 2/1997 | Antone ........................ 327/434 |
| 5,621,257 A | | 4/1997 | Kawakami .................. 307/125 |
| 5,923,543 A | * | 7/1999 | Choi ............................ 363/19 |
| 5,926,093 A | * | 7/1999 | Bowers et al. ............. 340/10.3 |
| 5,962,993 A | * | 10/1999 | Kashiwagi .................. 315/371 |
| 6,028,468 A | | 2/2000 | Menniti et al. ............. 327/333 |
| 6,061,253 A | * | 5/2000 | Igarashi et al. .............. 363/19 |
| 6,208,185 B1 | | 3/2001 | John et al. .................. 327/170 |
| 6,271,709 B1 | | 8/2001 | Kimura et al. .............. 327/380 |

* cited by examiner

Primary Examiner—Bao Q. Vu
(74) Attorney, Agent, or Firm—Harness, Dickey & Pierce, P.L.C.

(57) ABSTRACT

A half sine wave resonant drive circuit provides a greater duty cycle range of operation without a loss in power, particularly at higher frequencies. A resonant circuit is capacitivly coupled to a single switching device to provide the greater duty cycle range by recycling the gate charge of the switching device through the resonant circuit. A half sine wave drive signal is thereby produced from an input square wave signal. The driving amplitude is constant for operation over the range of duty cycles.

24 Claims, 5 Drawing Sheets

HALF SINE WAVE RESONANT DRIVE CIRCUIT

FIELD OF THE INVENTION

The present invention relates generally to power electronic devices, and more particularly to drive circuits for MOS gated power electronic devices.

BACKGROUND OF THE INVENTION

Metal Oxide Semiconductor (MOS) devices are constructed having a voltage controlled gate electrode. In operation, these devices are turned on by the application of bias (i.e., voltage) to the gate electrode. The gate provides capacitance to other electrodes (e.g., source and drain electrodes in a metal-oxide-silicon field-effect transistor) in these devices that need to be charged and discharged in order to turn the device on and off (i.e., charge is injected or extracted from the gate). In determining the operating requirements of these devices, the charge multiplied by the bias voltage represents a "turn on" and "turn off" energy.

In many power semiconductor applications, the device must be alternately turned on and off, often in conjunction with other devices, to thereby form a power conversion circuit. There is a desire to increase the frequency of operation (i.e., switching speed) of such circuits, which allows these circuits to be implemented with smaller and cheaper associated passive components. However, with the frequency of operation increased, the power required by the gate drive circuit increases proportionately (i.e., power equates to energy times frequency).

With respect specifically to gate drive circuits, half bridge circuits are commonly used either discretely or as part of a power MOS driver integrated circuit (IC). Using such a bridge type circuit, the gate is charged and discharged from a voltage source via the output resistance of the driver, the gate spreading resistance of the controlled device and any added series resistance. Thus, the forward and reverse passage, of charge through this resistance (i.e., the devices creating the resistance) results in a power loss. It should be noted that this charge flows as the driver switches, such that the driver will not necessarily be saturated, thereby resulting in higher resistance than the quoted "fully on" value of the driver. Reducing the resistance will not help reduce the loss as it just enables the same charge to flow more quickly.

In recent years, MOS gated power devices have replaced bipolar devices in many applications as a result of the advantages of MOS technology. For example, MOS gated power devices do not have static (i.e., DC) drive power consumption. In these devices, some AC power loss is acceptable, and at frequencies up to a few hundred kilohertz (KHz), this loss is often insignificant compared to other power losses in the circuit.

As frequencies are increased problems result. In particular, switching losses may increase and power dissipation in the switching device may also increase. In an attempt to address these problems, zero voltage, zero current and resonant switching techniques have been increasingly implemented in power conversion circuits. These circuits typically recirculate or recycle the energy involved in switching the device output capacitance, thereby reducing the power dissipation of the device and increasing overall efficiency.

Known devices, such as, for example, the MOS drive circuits shown in FIGS. 1 and 2, use a high Q (i.e., quality factor, which is a measure of the dissipation in a system) resonant circuit in the gate circuit to "absorb" the gate capacitance, and generate a sinusoidal gate voltage. Essentially, a filter circuit (i.e., single element high Q tuned circuit in FIG. 1 and a four element filter circuit in FIG. 2) is provided to produce the sine wave signal. Specifically, in a typical half bridge configuration, a gate drive transformer is inserted between the resonant circuit and gate, with the transformer phased such that each device is driven with opposing phase. Correct switching of a driver device connected to the resonant circuit can eliminate most of the driver loss. However, only a very limited duty cycle is provided (i.e., at or about 50 percent).

Full sine wave resonant drive circuits provide limited control of duty cycle by varying amplitude, which affects the crossing point of the waveform and the threshold voltage of the driven device. In operation, reducing the drive voltage in order to significantly reduce the duty cycle will result in low amplitude past the gate threshold, and thus, poor saturation.

Therefore, known MOS drive circuits provide only very limited effective duty cycle operation, which is essentially 50 percent less the delays between the zero crossing and the gate threshold voltage. Reducing the amplitude will reduce the duty cycle, but also lengthen the switching time and reduces the "peak on bias." This will increase "DC on" losses.

In general, it is desirable to switch the controlled device off as fast as possible. As frequencies are increased, a greater portion of the switching period is required for the switching transition, thus requiring a shorter conduction time, which is shorter than can be achieved by known circuits.

Thus, there exists a need for a system having a drive circuit capable of effectively operating (i.e., no or nominal loss in power) over a greater range of duty cycles (i.e., about 25 percent to about 50 percent), and in particular, to such a system for driving gated power devices (e.g., MOS devices) over this greater range at higher frequencies. Such a system needs to control the duty cycle without requiring the reduction of source amplitude to unacceptable levels at these higher frequencies.

SUMMARY OF THE INVENTION

The present invention generally provides a half sine wave drive circuit and method of providing the same having independent adjustment of amplitude and duty cycle that recirculates or recycles the energy involved in switching the input capacitance of the driven device (e.g., MOS gated power device). Thus, the power dissipation of the device is reduced and overall efficiency increased, particularly at higher frequency operation (i.e., more than a few hundred KHz). In operation the present invention provides duty cycles of between about 25 percent and about 50 percent without loss of device power (i.e., no switching loss) at higher switching frequencies.

Specifically, a drive circuit for use in connection with a power device (e.g., MOS gated power device) includes switching means for providing effective operation over a greater duty cycle range, and a gate drive means for producing from a square wave input signal a half sine wave output signal for use as a drive voltage to the switching means to produce the greater duty cycle range. The gate drive means includes a resonant circuit capacitivly coupled to a gate of the switching means.

The switching means may be a transistor with the gate drive means providing the half sine wave output signal to the gate of the transistor. The resonant circuit is adapted to be configured between the operating frequency of the input signal and about twice the operating frequency to thereby provide a duty cycle of between about 50 percent and about 25 percent. Essentially, a driver inductance and capacitance of the resonant circuit are adapted to be configured to control the duty cycle based upon a drive frequency. The driver inductance of the resonant circuit may comprise a transformer, and in this construction, may be adapted to be configured to provide a duty cycle of between about 50 percent and about 75 percent.

A DC bias means further may be provided to control the DC level of the circuit. The resonant circuit may comprise, for example, a class E single ended resonant circuit capacitivly coupled to the gate of the switching means. A hard switch, such as a logic gate, may be included for providing the input signal. The relatively low power required at this input results in the power lost, and hence dissipation, in the logic gate to not be excessive.

In another embodiment, a resonant drive circuit of the present invention providing improved independent amplitude and duty cycle control without loss of power at higher operating frequencies includes a MOS controlled device (e.g., transistor) to be switched to provide a duty cycle of between about 25 percent and about 50 percent. A resonant drive circuit capacitivly coupled to a gate of the MOS controlled device is also included and provides from a square-wave input signal, a half sine wave output signal for driving the MOS controlled device. The resonant drive circuit is adapted for operation between an operating frequency of a driven device (e.g., MOS gated power device) and about twice the operating frequency, defined by the input signal.

A driver inductance and capacitance of the resonant drive circuit are configurable to provide the duty cycle of between about 25 percent and about 50 percent. A DC bias may be provided to control the DC level of the half sine wave signal. The resonant circuit may include a transformer for providing the driver inductance. A hard switched input device may be included for providing the input signal.

A method of the present invention for controlling the amplitude and duty cycle of a drive circuit without losing power at higher operating speeds includes receiving a square wave input signal, producing a half sine wave output signal from the square wave input signal using a resonant circuit capacitivly coupled to a switching a device, and configuring the resonant circuit to operate at a duty cycle of between about 25 percent and about 50 percent. DC bias also may be provided to the resonant circuit.

The method further may include recycling through the resonant circuit a gate charge of the device being switched. A transformer also may be used in connection with the resonant circuit to add isolation or invert the drive waveform for 50 to 75 percent duty operation.

Thus, the present invention provides a resonant drive circuit and method of providing the same that is capable of operation over a greater duty cycle range (i.e., from about 25 percent to about 50 percent) without experiencing power loss at higher frequencies. Through the adjustment of components within the resonant circuit, an appropriate duty cycle may be provided for driving a switching device, such as, for example, a MOS gated power device.

Further areas of applicability of the present invention will become apparent from the detailed description provided hereinafter. It should be understood that the detailed description and specific examples, while indicating the preferred embodiments of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses. Thus, although the application of present invention as disclosed herein is generally directed to a resonant drive circuit having a specific configuration for use in driving a particular device, it is not so limited, and other configurations for driving different devices may be provided in accordance with the present invention.

Figure 1:
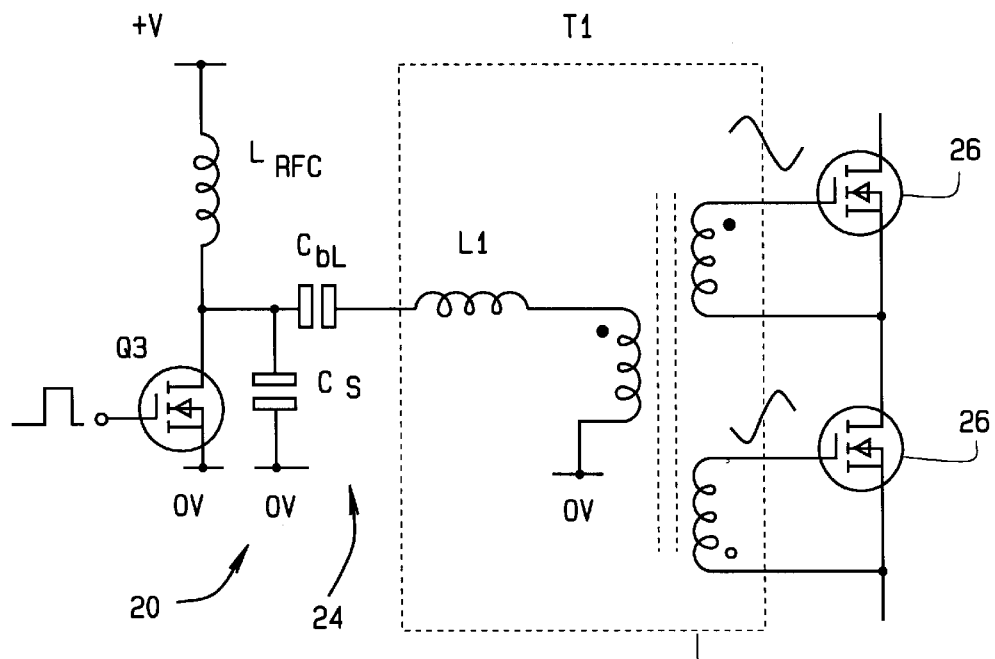
FIG. 1 is a schematic diagram of a typical full sine wave drive circuit.
Figure 2:
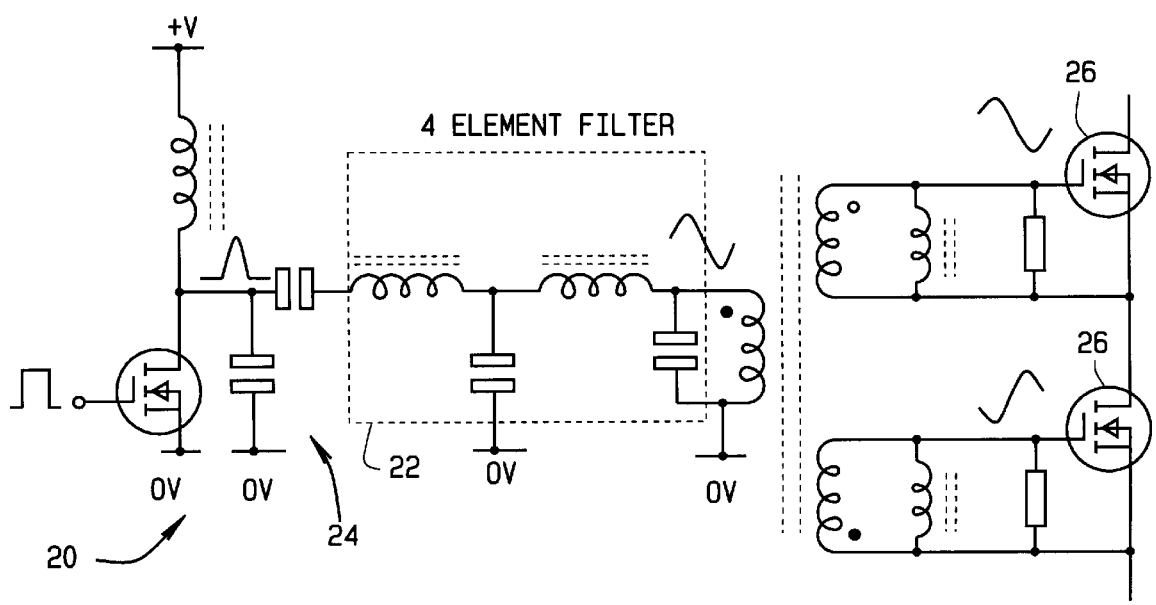
FIG. 2 is a schematic diagram of another typical full sine wave drive circuit.

In a typical resonant drive circuit as shown in FIGS. 1 and 2, and generally indicated by reference numeral 20 therein, a full sine wave resonant drive circuit is provided for use in connection with, for example, a MOS device. In particular, a transformer in combination with a series resonant circuit 24, provides sinusoidal outputs based upon a square wave voltage input signal. The sinusoidal outputs are used to control switching devices 26, which as shown, are insulated-gate field-effect transistors, which are typically provided in a half-bridge configuration. It should be noted that other types of transistors may be implemented depending upon the particular application and drive requirements.

The outputs of the switching devices 26 are combined and provided to the output network transformer, etc. Essentially, a transformer-coupled push-pull operation (e.g., push-pull amplifier) is provided, and may be used, for example, in power conversion applications. It should be noted that other configurations are possible, including, for example, parallel connection. In operation, in order to change the duty cycle in the drive circuits 20 shown in FIGS. 1 and 2, which is accomplished by changing the length of "dead time" or transition time between turning off one switching device and turning on the other switching device, the amplitude of the input signal to each of the switching devices must be reduced. This may result in unacceptable operating voltages, thus resulting in improper operation of the driven device, particularly at higher operation frequencies (i.e., greater than 100 KHz).

Having described typical full sine wave drive circuits which have limited control of duty cycle because of power problems, particularly at higher frequencies, the present invention generally provides a half sine wave resonant drive circuit having a greater range of control of duty cycle without requiring a lower amplitude (i.e., loss of power), including at higher operating frequencies. In operation, a half sine wave output is provided to a single switching device to control operation of that driven device (e.g., MOS gated power device).

Figure 3:
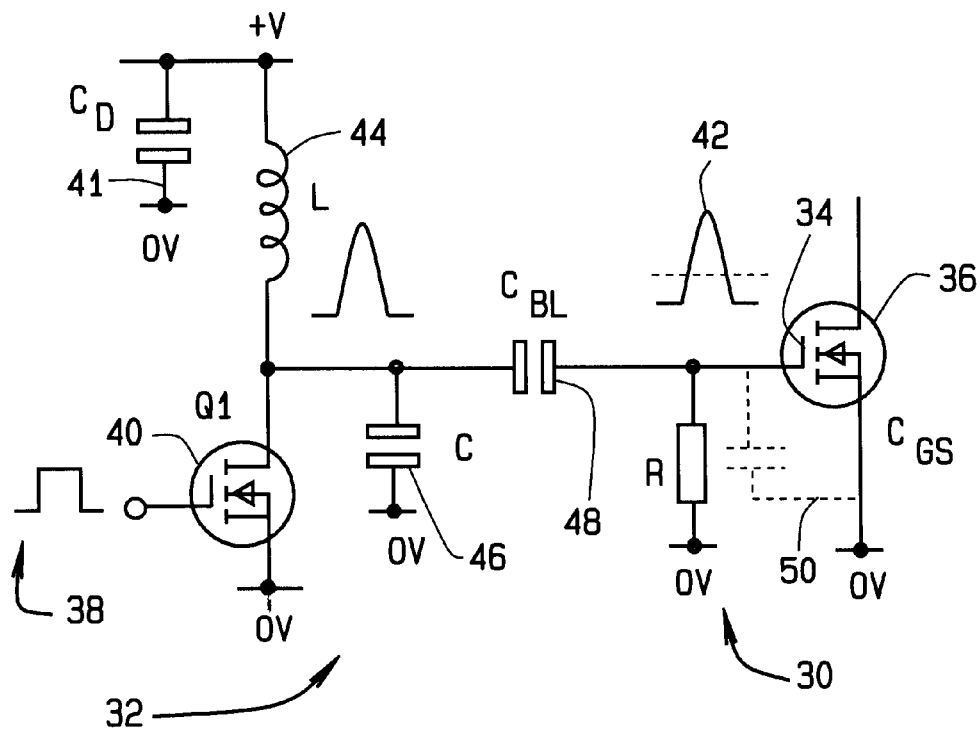
FIG. 3 is a schematic diagram of a half sine wave drive circuit constructed according to the principles of the present invention.

In particular, and referring to one exemplary construction of a half sine wave drive circuit configured according to the principles of the present invention, such a drive circuit is shown in FIG. 3 and indicated generally therein by reference numeral 30. As shown therein, a class E single ended resonant circuit 32 is capacitivly coupled to the gate 34 of a power switching device 36 (e.g., insulated-gate field-effect transistor).

Generally, in operation, a square wave voltage signal input 38 is provided to a driver switching device (Q1) 40 (e.g., transistor) with the drive circuit 30 of the present invention producing a positive half sine wave signal 42 at the gate terminal 34 of the power switching device 36. The positive half sine wave signal 42 has a period that is proportional to the resonant frequency defined by a driver inductance (i.e., inductor L) 44, a capacitance (i.e., capacitor C) 46, a coupling capacitance (i.e., capacitor $C_{BL}$) 48 and a driven gate capacitance (i.e., capacitor $C_{gs}$) 50. The positive half sine wave signal may be provided at between about the operating resonant frequency and about twice the operating resonant frequency based upon the square wave voltage signal input 38 frequency to thereby provide a duty cycle of between about 50 percent and about 25 percent. The driver switching device (Q1) 40 in this exemplary construction experiences normal zero voltage switching class E conditions, and thus experiences no switching loss. All the gate charge is recycled between the gate terminal 34 and driver supply stored in the supply decoupling capacitor (Cd) 41.

Figure 4:
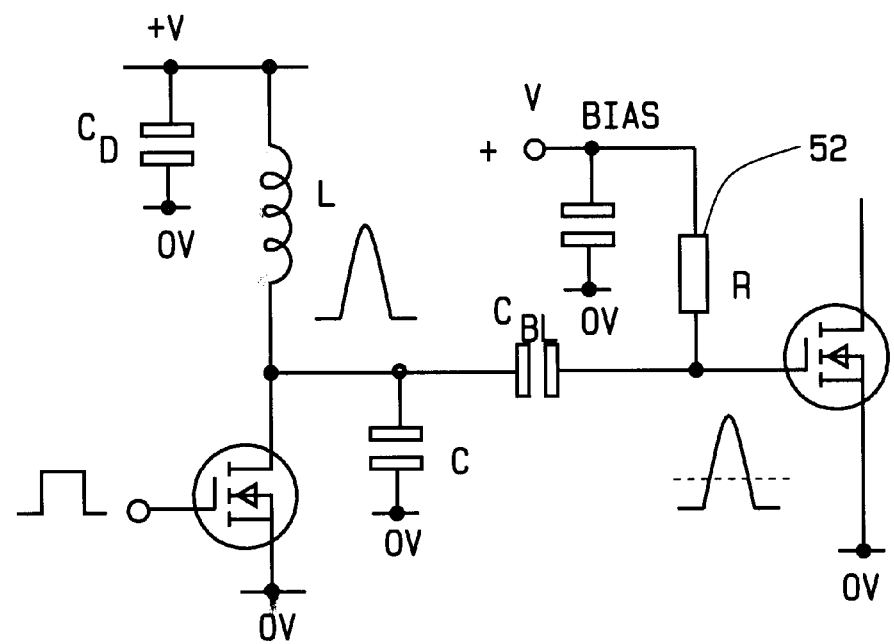
FIG. 4 is a schematic diagram of the half sine wave drive circuit of FIG. 3 with DC bias.
Figure 5A:
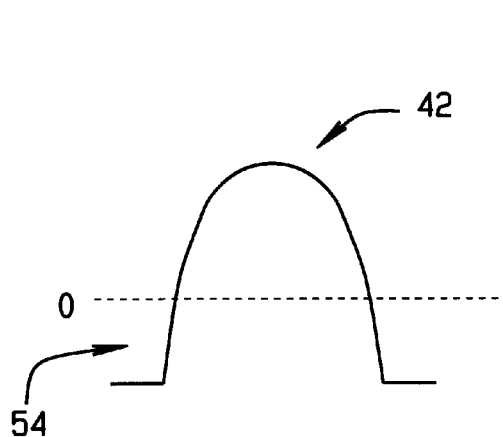
FIGS. 5(*a*) and 5(*b*) are graphs showing sine wave signals produced by the half sine wave drive circuits of FIGS. 3 and 4.
Figure 5B:
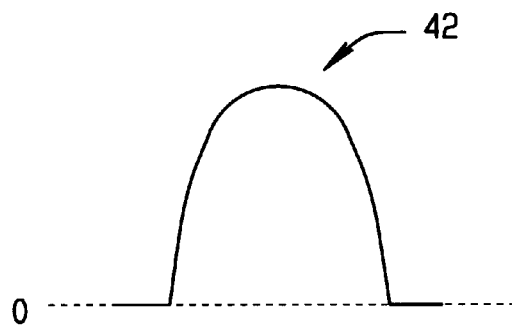

With the gate terminal 34 capacitivly coupled to the resonant circuit 32, the positive and negative volt/seconds will balance, resulting in some negative off bias. Additional DC bias can be added to counteract the negative off bias so as to maximize the positive AC swing. For example, and as shown in FIG. 4, a resistance (i.e., resistor R) 52 may be provided for coupling any DC bias or grounding leaking currents. As shown in FIG. 5(a), the half sine wave signal 42 produced by the drive circuit 30 may have a negative component 54, as the DC level of the circuit is undefined due to the capacitive coupling. With the addition of appropriate resistance 52 (i.e., to compensate for negative off bias), the negative component 54 can be reduced or virtually eliminated to produce a half sine wave signal 42' as shown in FIG. 5(b).

Figure 6A:
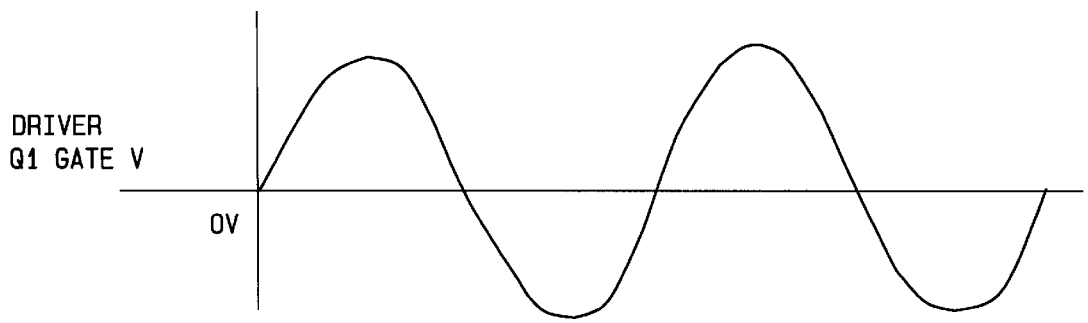
FIGS. 6(*a*)–6(*c*) are graphs showing driver voltages produced by the half sine wave drive circuit of the present invention.
Figure 6B:
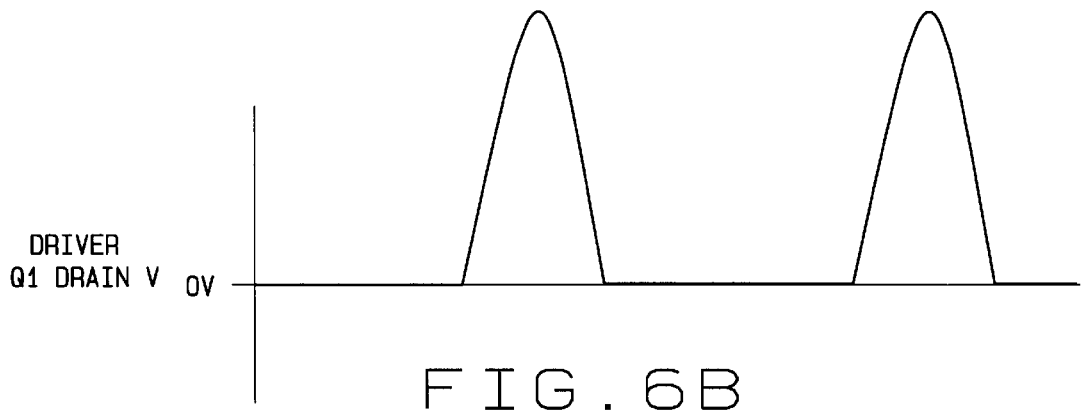
Figure 6C:
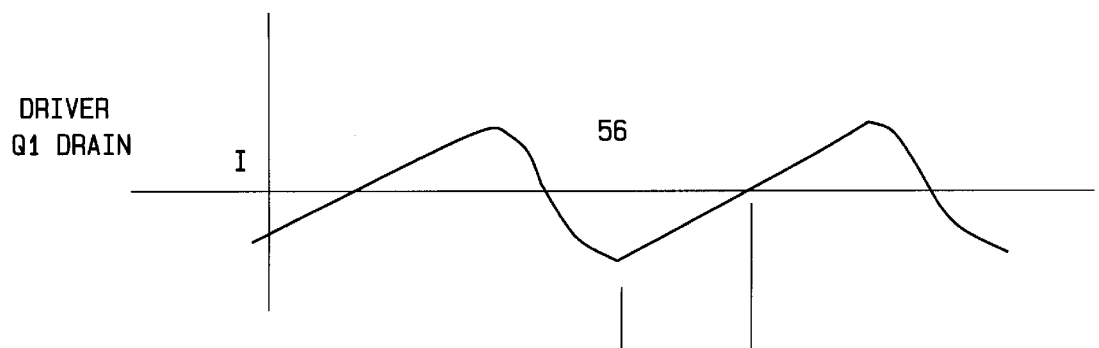

The driver switching device (Q1) 40 is typically driven with an approximately 50:50 duty cycle in a known manner. However, in operation, this does not force the driver switching device (Q1) 40 output to switch at 50:50. As shown in FIGS. 6(a)–6(c), during the cycle after the voltage has fallen to zero, indicated as t1 at 56, the driver switching device (Q1) 40 reverse conducts, thereby returning the resonant energy to the driver switching device (Q1) 40 supply stored in Cd 41. Thus, it is only necessary for the driver switching device (Q1) 40 to be turned on at some point before all this energy is recovered.

Figure 7:
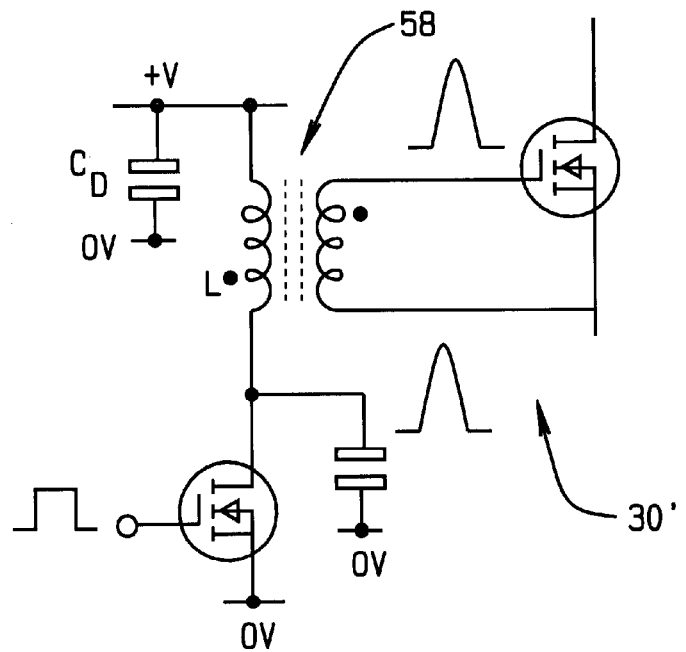
FIG. 7 is a schematic diagram of another construction of a half sine wave drive circuit of the present invention with transformer coupling.

In an alternate construction of a half sine wave drive circuit 30' as shown in FIG. 7, the driver inductance 44 may be configured as a transformer 58 to add isolation between the driver switching device (Q1) 40 and an output device. This construction may also provide phase inversion for duty cycles of typically between about 50 percent and about 75 percent with a negative half sine signal. Alternately, a driver switching device (Q1) 40 with the opposite polarity may be used.

Figure 8:
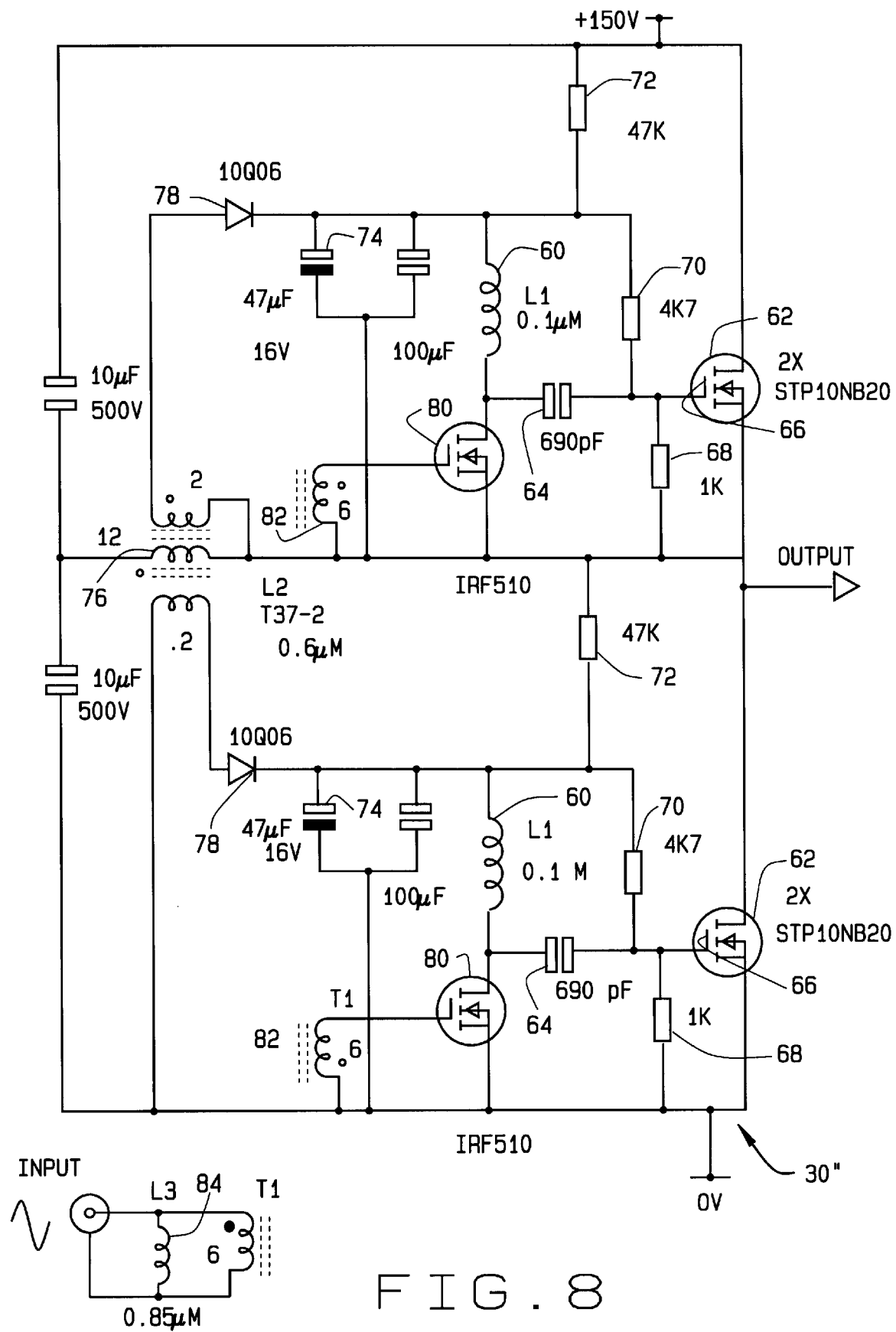
FIG. 8 is a schematic diagram of a half sine wave drive circuit of the present invention providing operation at 13.56 MHz.

As a further specific example of a half sine wave drive circuit 30 constructed according to the principles of the present invention, and to more clearly show such a circuit having particular operating characteristics, FIG. 8 shows a half sine wave drive circuit 30" constructed for operation at 13.56 MHz. As shown therein, inductors (L1) 60 resonate with the capacitance of the gates 66 of the STP10NB20 transistors 62 via the 690 pF capacitors 64 to produce a half sine pulse at approximately 18 MHz (i.e:, about a 38 percent duty cycle). DC bias is applied to the gates 66 via the 1K resistors 68 and 4K7 70, forming a potential divider.

A start up supply is bled from the main DC rail via the 47K resistors 72. Charge stored in the 47 uF capacitors 74 begins drive operation until the output swing has built up enough amplitude to supply power via the two turn windings on inductor (L2) 76 and the 1DQ06 diodes 78. The current into the inductor (L2) 76 facilitates switching the output capacitance of the STP10NB20 62. The IRF510s transistors 80 are driven sinusoidaly in antiphase by transformers (T1) 82, with their gate capacitance resonated out by inductor (L3) 84 at the input.

Thus, the present invention provides a half sine wave resonant drive circuit having independent amplitude and duty cycle control over a greater duty cycle range (i.e., about 25 percent to about 50 percent) by providing short enough duty cycles to allow enough time for output capacitance. charging/discharging, thereby resulting in efficient switching. As disclosed herein, the invention is particularly well suited for operation at higher frequencies (e.g., 10+ MHz). For example, operation at a greater range of duty cycles is particularly adapted for use in high frequency half bridge circuits wherein significant dead time is needed between alternate conduction to cycle the output capacitance of the bridge device. It should be noted that the half sine wave signal normally contains significant harmonics, and as such, any transformer provided in connection with the present invention must have enough high frequency performance and bandwidth to, reliably pass these harmonics.

Although the present invention has been described in connection with specific component parts operating at specific frequencies, it is not so limited. For example, in constructing a half sine wave drive circuit 30 according to the present invention, the inductance 44, capacitance 46 and capacitance 48 may be adjusted to obtain the desired gate 34 swing for a particular driver DC voltage and driver device swing. Further, the driven device may be any MOS controlled device such as a MOSFET, IGBT, etc. Additionally, the driver device may be MOS controlled or bipolar and include an anti parallel diode to provide reverse conduction.

The description of the invention is merely exemplary in nature and, thus, variations that do not depart from the gist of the invention are intended to be within the scope of the invention. Such variations are not to be regarded as a departure from the spirit and scope of the invention as claimed.

What is claimed is:

1. A drive device providing improved operation and control of duty cycle, the drive device comprising:

switching means having a gate and providing operation at a duty cycle based upon a drive signal; and a gate drive means for producing from an input signal a half sine wave output signal for use as the drive signal to the switching means, the gate drive means having a resonant circuit coupled to the gate of the switching means.

2. The drive device according to claim 1 wherein the switching means comprises a transistor and the gate drive means provides the half sine wave output signal to the gate of the transistor.

3. The drive device according to claim 1 wherein the input signal is a square wave and the resonant circuit is adapted to be configured between an operating frequency and about twice the operating frequency of the square wave input signal to thereby provide a duty cycle of between about 50 percent and about 25 percent.

4. The drive device according to claim 3 wherein the resonant circuit comprises a driver inductance and capacitance together adapted to be configured to control the duty cycle based upon a drive frequency defined by the square wave input signal.

5. The drive device according to claim 1 wherein the resonant circuit comprises a driver inductance having a transformer and is adapted to be configured to provide a duty cycle of between about 50 percent and about 75 percent.

6. The drive device according to claim 1 further comprising DC bias means.

7. The drive device according to claim 1 wherein the resonant circuit comprises a class E single ended resonant circuit capacitivly coupled to the gate of the switching means.

8. The drive device according to claim 1 wherein the switching means is a metal oxide semiconductor.

9. The drive device according to claim 3 further comprising a hard switch for providing the square wave input signal.

10. A half sine wave drive circuit providing improved independent amplitude and duty cycle control without power loss at higher operating frequencies, the half sine wave drive circuit comprising:

a MOS controlled device to be switched to provide a duty cycle of between about 25 percent and about 50 percent, and having a gate; and a resonant drive circuit capacitivly coupled to the gate of the MOS controlled device for providing from a periodic input signal a half sine wave output signal for driving the MOS controlled device and adapted for operation between an operating frequency and about twice the operating frequency of the periodic input signal to thereby switch the MOS controlled device.

11. The half sine wave drive circuit according to claim 10 wherein the periodic input signal is a square wave and the resonant drive circuit comprises a driver inductance and capacitance together configurable to provide the duty cycle of between about 25 percent and about 50 percent.

12. The half sine wave drive circuit according to claim 10 further comprising a DC bias means.

13. The half sine wave drive circuit according to claim 10 wherein the resonant drive circuit comprises a transformer providing a driver inductance.

14. The half sine wave drive circuit according to claim 10 wherein the MOS controlled device is a switching device comprising a transistor.

15. The half sine wave drive circuit according to claim 10 adapted for providing the duty cycle of between about 25 percent and about 50 percent during operation at frequencies exceeding 10 MHz.

16. The half sine wave drive circuit according to claim 11 further comprising a hard switched input device for providing the square wave input signal.

17. A method of controlling the duty cycle of a drive circuit without losing power at higher operating frequencies, the method comprising the steps of:

receiving a periodic input signal;

producing a half sine wave output signal from the periodic input signal using a resonant circuit capacitivly coupled to a switching device; and configuring the resonant circuit to provide the half sine wave output signal to thereby operate the switching device at a duty cycle of between about 25 percent and about 50 percent.

18. The method according to claim 17 further comprising providing DC bias to the resonant circuit.

19. The method according to claim 17 wherein the periodic input signal is a square wave.

20. The method according to claim 17 further comprising using a transformer in connection with the resonant circuit to add isolation.

21. The method according to claim 17 further comprising using a transformer in connection with the resonant circuit to invert the driving waveform to provide a duty cycle of between about 50 and 75 percent.

22. The half sine wave drive circuit according to claim 10 wherein the periodic input signal is a square wave and the resonant drive circuit comprises a driver inductance and capacitance together configurable to provide from an input frequency a resonant frequency response from between about the input frequency and twice the input frequency.

23. The half sine wave drive circuit according to claim 10 wherein the resonant drive circuit is configured to recycle energy provided for switching the input capacitance of the MOS controlled device.

24. The half sine wave drive circuit according to claim 23 wherein a charge at the gate of the MOS controlled device is recycled between the gate of the MOS controlled device and a driver supply stored in a supply decoupling capacitor.

* * * * *